United States Patent [19]
Edwards et al.

[11] 3,949,206
[45] Apr. 6, 1976

[54] FILTERING DEVICE
[75] Inventors: Thomas R. Edwards; Hugh W. Zeanah, both of Huntsville, Ala.
[73] Assignee: The United States of America as represented by the Administrator of the National Aeronautics and Space Administration, Washington, D.C.
[22] Filed: Dec. 17, 1974
[21] Appl. No.: 533,608

[52] U.S. Cl. .................... 235/156; 325/42; 333/18
[51] Int. Cl.² ........................................ G06F 15/34
[58] Field of Search ................. 235/152, 156, 181; 328/167; 333/18, 28, 70 T; 325/42, 65

[56] References Cited
UNITED STATES PATENTS
3,370,292  2/1968  Deerfield ................. 343/5
3,665,171  5/1972  Morrow .................. 235/152
3,798,560  3/1974  Taylor ................... 328/167
3,821,527  6/1974  Kang .................... 235/152

Primary Examiner—Joseph F. Ruggiero
Attorney, Agent, or Firm—George J. Porter; L. D. Wofford, Jr.; John R. Manning

[57] ABSTRACT

An electrical filter for removing noise from a voice communications signal in which, for example, seven sample values of the signal are obtained continuously updated and subjected to filtering. Filtering is accomplished by adding balanced, with respect to a midpoint sample, spaced pairs of the sampled values and then multiplying each pair by a selected filter constant. The signal products thus obtained are summed to provide a filtered version of the original signal.

1 Claim, 1 Drawing Figure

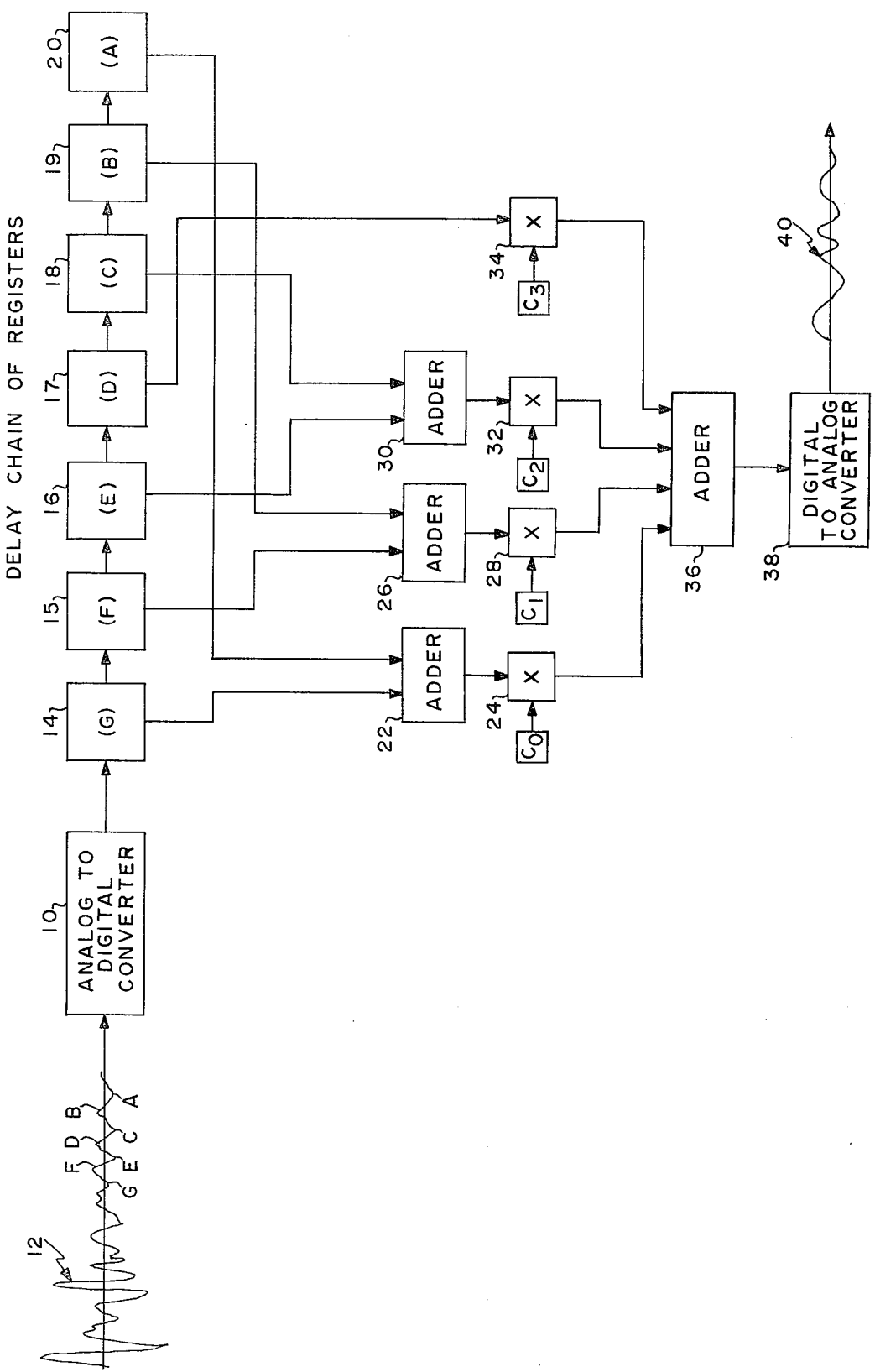

FILTERING DEVICE

ORIGIN OF THE INVENTION

The invention described herein was made by employees of the United States Government and may be manufactured and used by or for the Government of the United States of America for governmental purposes without the payment of any royalties thereon or therefor.

BACKGROUND OF THE INVENTION

1. Field of the Invention

This invention relates to electrical filters, and particularly to a digital type filter.

2. General Description of the Prior Art

The removal of noise from communications signals, particularly those transmitted by radio where atmospheric noises are mixed with the signals, has long been a problem. Many types of filters have been devised to remove the noise. Usually they have been of the reactance type which function to block frequencies above and below the signal spectrum, approximately 300 to 3,000 Hertz in the case of voice signals. With the development of the digital computer, efforts have been made to solve the noise problem digitally by converting sampled values of a signal to digitally encoded bits and then performing, at very high speeds, various modifications to the encoded bits. The difficulty has been that the computer programs employed to accomplish this task have been too complex, too demanding of computer hardware, and too expensive.

It is the object of this invention to provide a new and improved means of filtering communications signals which substantially reduces the hardware requirement and yet enables extremely effective filtering.

SUMMARY OF THE INVENTION

In accordance with the invention, a communications signal to be filtered is continuously sampled at equally time-spaced sample points to provide a continuously updated plurality of time-spaced electrical samples of the signal. Sample pairs, balanced with respect to a mid-point sample, are added to thus provide a plurality of signal sums. Each of the signal sums and the mid-point sample are then separately multiplied by a selected filter constant and the products obtained are summed to provide a filter output. Specific filter factors for low-pass and high-pass filters is described herein. Other filter factors may be determined from multiparameter optimization theory and regression calculations, examples of which have been published by A. Savitzky and M. J. E. Golay, Anal. Chem., 36, 1627 (1964), and J. Steiner, Y. Termonia, and J. Deltour, Anal. Chem., 44, 1906 (1972), and T. R. Edwards, Double Convolution Coefficients (to be published).

BRIEF DESCRIPTION OF THE DRAWING

The drawing is an electrical schematic circuit diagram of an embodiment of the invention.

DETAILED DESCRIPTION OF THE PREFERRED EMBODIMENT

Analog to digital (A-D) converter 10 converts sampled data points A–G of input audio signal 12 to a like designated series of digitally encoded values, each value representative of one of the sampled data points. It will be assumed that the spectrum of audio signal 12 is in the range of 300 to 3,000 Hertz and that the sampling rate of analog to digital converter 10 is at least 10,000 samples per second. The digitally encoded sample values from A-D converter 10 are fed and shifted, sequentially, through a delay chain of shift registers 14–20, which will thus contain, at any instance, a series of digital representations of the sampled data points, as parenthetically labeled. Shift registers 14–20 form a delay chain of registers which enable simultaneous presentation of what are in fact time-spaced samples. In accordance with the invention, an odd number of registers are employed. This is done for the purpose of unambiguously establishing the center point at mathematical position zero, a replacement value.

Weighted averaging of the thus sampled data is accomplished as follows. The first and last, in time, sample bits of registers 20 and 14 are added in digital adder 22 to provide a first input to digital multiplier 24. The next to first and next to last, in time, sample outputs from registers 19 and 15 are added in digital adder 26 and provide a first input to digital multiplier 28. The second from first and second from last, in time, sample outputs from registers 18 and 16 are added in digital adder 30 and the sum provided as a first input to digital multiplier 32. Finally, the center sample bit, the output of digital register 17, is applied as a first input to digital multiplier 34.

To each of digital multipliers 24, 28, 32, and 34 is fed a multiplying filter constant, $C_0$, $C_1$, $C_2$, and $C_3$, respectively. The selection of constants is based upon the particular characteristic of filtering desired, and as a typical set of constants to achieve a low-pass filter which has the effect of removing high frequency noise, noise higher than 3,000 Hertz the maximum frequency of the communications signal shown, reference is made to Table 1 of the Savitzky and Golay reference referred to above. This table indicates that where seven points are sampled that filter factors progressively applied would have the following weighted values:

| Sample Point | Factor |
| --- | --- |
| −03 | −2 |
| −02 | 3 |
| −01 | 6 |
| 00 | 7 |
| 01 | 6 |
| 02 | 3 |
| 03 | −2 |

The present invention makes use of only the last four constants, which are 7, 6, 3, and −2; and they are applied, in that order, as second inputs of multipliers 24, 28, 32, and 34 for the constant inputs $C_0$, $C_1$, $C_2$, and $C_3$.

As an example of a set of constants for a high-pass filter, reference is made to Table 3 of the Golay and Savitzky reference and wherein equated filter constants would be 0, 1, 2, and 3, respectively. Other filter characteristics for use with the present invention may be determined in accordance with the same theoretical consideration described in the Savitzky and Golay reference. While seven sample points are utilized in the example, additional ones may be employed by addition of shift registers, adders, and multipliers. The effect of additional samplings is that of raising the upper limit of the bandpass frequencies. However, it is a significant finding by the applicant that an extremely effective filtering job can be accomplished by using only seven sampling points, with double convolution coefficients, and with the additional consideration of hardware.

The compensated outputs of multipliers 24, 28, 32, and 34 are digitally added by adder 36 and the output of adder 36 applied to digital to analog converter 38, which converts the signal information back to analog form as depicted by waveform 40, a waveform which is a replica of a portion of input waveform 12 but with a substantial quantity of signal noise eliminated.

What is claimed is:

1. A filtering system for removing noise above 3,000 cycles from a continuous audio frequency signal of frequencies in the range of 300 to 3,000 Hertz comprising:
   analog-to-digital conversion means responsive to such a said signal for providing as an output a continuous chain of digital signals representative of sampled points on said signal at a rate of at least 10,000 samples per second;
   a chain of seven serially-connected shift registers, the input of the first of said shift registers being connected to the output of said analog-to-digital conversion means;
   first, second, and third summing means, each having first and second inputs and an output, outputs of the first and last of said chain of said shift registers being connected as said first and second input signals to said first summing means, the outputs of the second and sixth of said chain of shift registers being connected as said first and second inputs of said second summing means, and the outputs of the third and fifth of the chain of said shift registers being connected to said first and second inputs of said third summing means;
   first, second, third, and fourth product means, each comprising means for multiplying first and second applied inputs, an output of said first summing means being connected as a first input to first product means, the output of said second summing means being connected as a first input to said second product means, the output of said third summing means being connected as a first input to said third product means, and the output of the fourth of said chain of shift registers being connected to the first input of said fourth product means;
   filter constant means for applying weighted values to said product means, a value of −2 being coupled to said second input of said first product means, a value of 3 being connected to the second input of said second product means, a value of 6 being connected to the second input of said third product means, and a value of 7 being connected to the second input of said fourth product means;
   fourth summing means responsive to the outputs of said product means for providing as an output the sum of the outputs of said product means; and
   digital-to-analog conversion means responsive to the output of said fourth summing means for reproducing said signal as modified by removal of signal noise content above 3,000 cycles.

* * * * *